United States Patent
Sasaki

(10) Patent No.: US 9,726,981 B2
(45) Date of Patent: Aug. 8, 2017

(54) EXPOSURE APPARATUS, EXPOSURE METHOD, AND DEVICE MANUFACTURING METHOD

(71) Applicant: CANON KABUSHIKI KAISHA, Tokyo (JP)

(72) Inventor: Ryo Sasaki, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 6 days.

(21) Appl. No.: 14/852,658

(22) Filed: Sep. 14, 2015

(65) Prior Publication Data

US 2016/0091800 A1 Mar. 31, 2016

(30) Foreign Application Priority Data

Sep. 30, 2014 (JP) .................................. 2014-202122

(51) Int. Cl.
*G03B 27/54* (2006.01)
*G03B 27/42* (2006.01)
*G03F 7/20* (2006.01)

(52) U.S. Cl.
CPC ...... *G03F 7/70258* (2013.01); *G03F 7/70791* (2013.01)

(58) Field of Classification Search
CPC .................... G03F 7/70191; G03F 7/70258
USPC ......................................... 355/52, 53, 55, 67
See application file for complete search history.

(56) References Cited

U.S. PATENT DOCUMENTS

| 5,808,910 A * | 9/1998 | Irie | G03F 7/70425 250/491.1 |
| 6,312,859 B1 * | 11/2001 | Taniguchi | G03F 7/70258 430/22 |

FOREIGN PATENT DOCUMENTS

| CN | 102736422 A | 10/2012 |
| CN | 103545174 A | 1/2014 |
| JP | 07183214 A | 7/1995 |

OTHER PUBLICATIONS

Office Action issued in Chinese Appln. No. 201510567210.3 mailed Mar. 3, 2017. English translation provided.

* cited by examiner

*Primary Examiner* — Hung Henry Nguyen
(74) *Attorney, Agent, or Firm* — Rossi, Kimms & McDowell LLP

(57) ABSTRACT

An exposure apparatus includes: a projection optical system; an adjusting unit configured to adjust imaging characteristics of the projection optical system; and a controller configured to divide the plurality of shot regions into groups based on data of a shift in the pattern of each shot region and an order of the exposure, determine setting amounts of the imaging characteristics for each group, and control the adjusting unit to set the imaging characteristics to the setting amounts for each group. The setting amount is common to a plurality of shot regions in the group and varies among the groups. The controller performs the division such that the shot regions belonging to the same group have a sequential exposure order and all values of the shift in the shot regions belonging to the same group fall within a predetermined range.

14 Claims, 6 Drawing Sheets

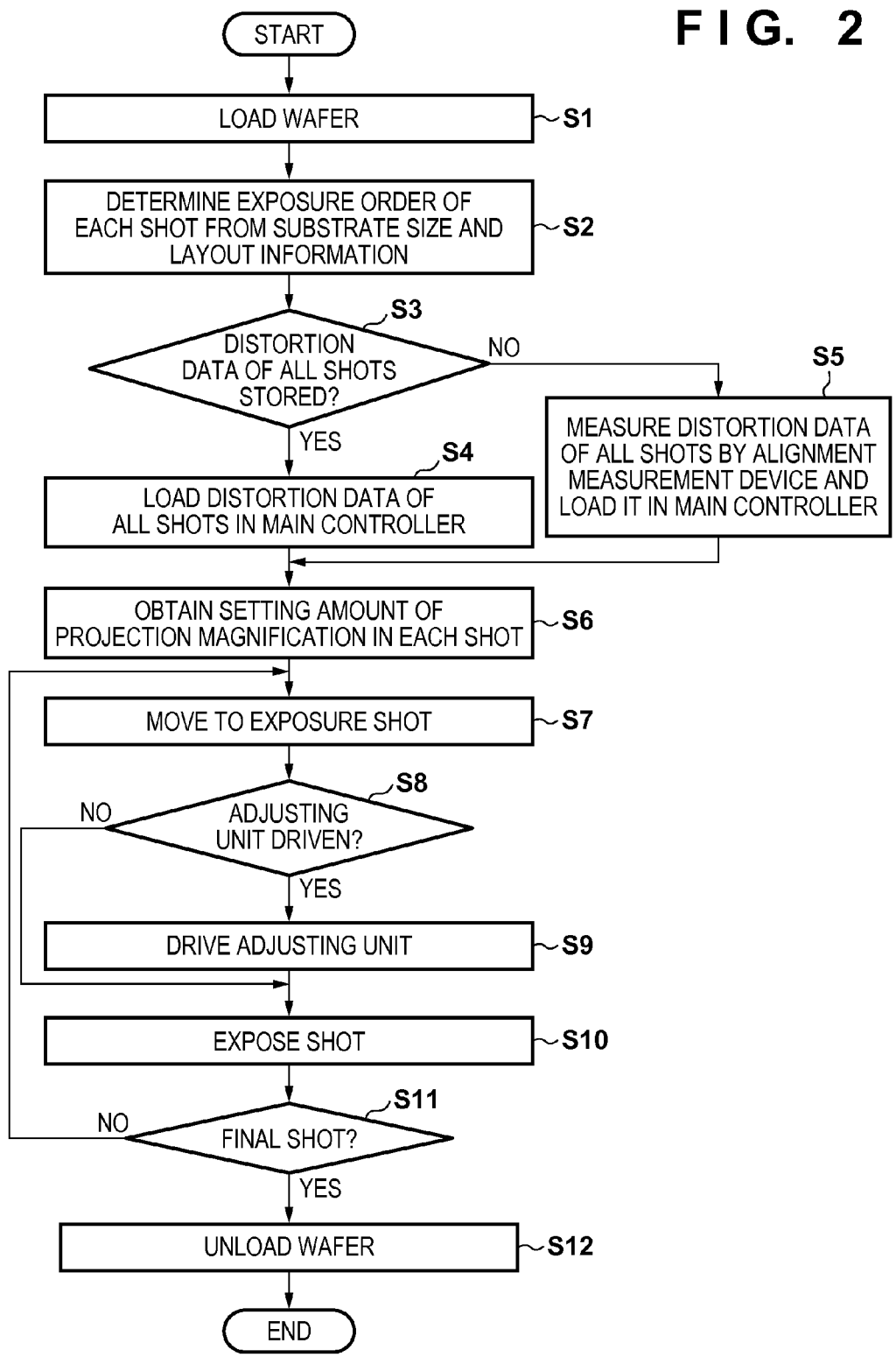

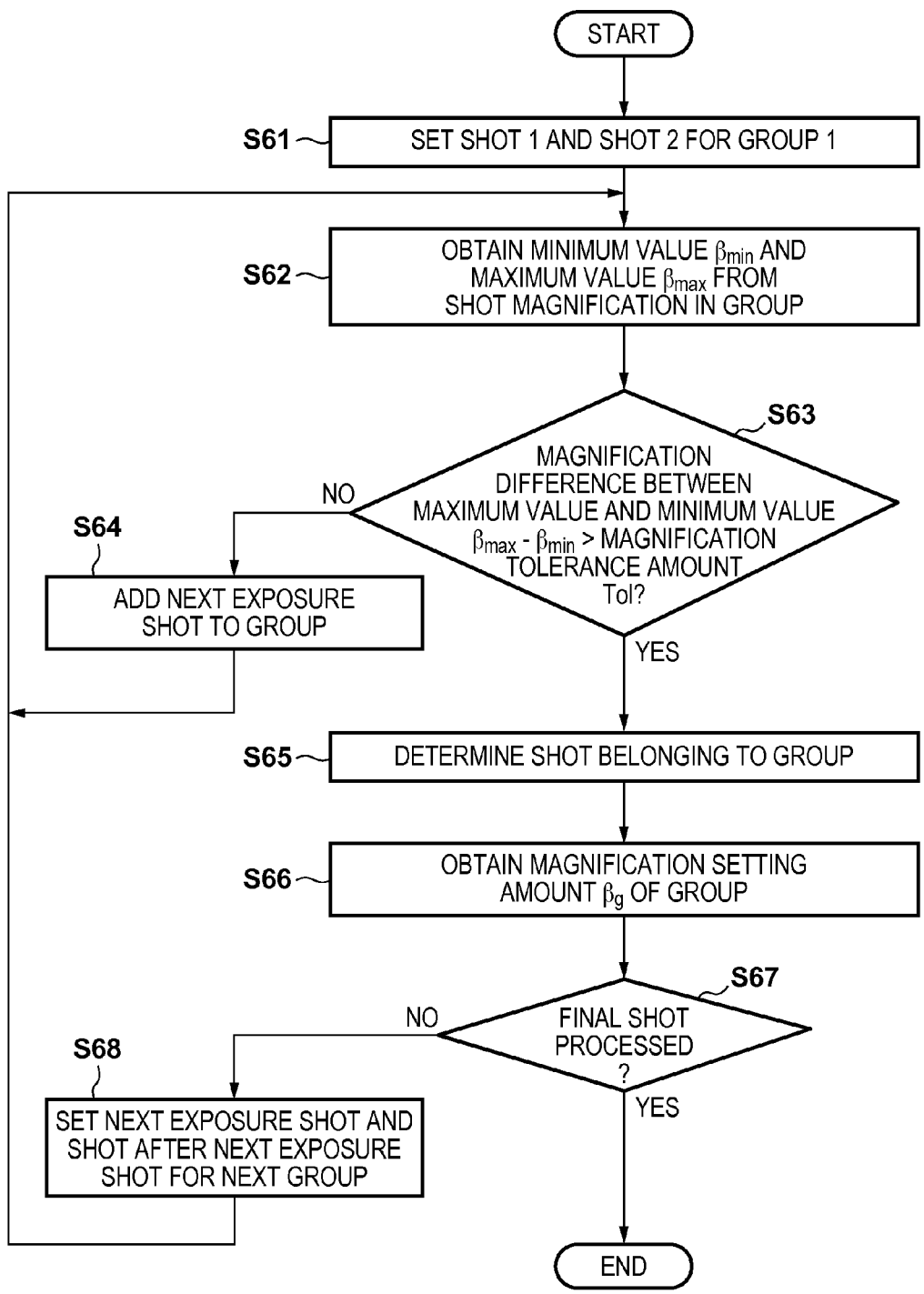

EXPOSURE APPARATUS, EXPOSURE METHOD, AND DEVICE MANUFACTURING METHOD

BACKGROUND OF THE INVENTION

Field of the Invention

The present invention relates to an exposure apparatus, an exposure method, and a device manufacturing method.

Description of the Related Art

Along with micropatterning of devices, extremely strict optical performance has been requested for the projection optical system of an exposure apparatus, and various imaging characteristic adjusting mechanisms such as a magnification adjusting mechanism and a distortion adjusting mechanism have been added. These imaging characteristic adjusting mechanisms mainly aim at correcting the assembly error of the projection optical system and correcting a change in imaging performance of the projection optical system caused by exposure heat. Japanese Patent Laid-Open No. 7-183214 has proposed an exposure apparatus including a correction system which corrects the projection magnification of a projection optical system. In the exposure apparatus described in Japanese Patent Laid-Open No. 7-183214, the projection magnification is adjusted in accordance with the shot magnification of a preceding shot, and is adjusted again in accordance with the shot magnification of a succeeding shot if the projection magnification for the preceding shot exceeds the tolerance of an alignment error of the succeeding shot.

Recently, a back-side illumination (BSI) sensor has been developed in order to improve the sensitivity of an image sensor. The BSI sensor is manufactured by bonding a device substrate to a supporting substrate to polish the back side of the device substrate, and then performing an overlay exposure of patterns such as a color filter and a microlens on the back side of the device substrate. A distortion is known to occur in this device substrate when bonding the device substrate to the supporting substrate to polish the back side of the device substrate. It is therefore necessary to perform an exposure by controlling the imaging performance (the magnification, the distortion, or the like) of the projection optical system in accordance with the distorted shape of the device substrate when performing the overlay exposure of the color filter, the microlens, and the like on the device substrate.

However, the imaging performance needs to be corrected greatly every time each shot is exposed because the distortion amount of this device substrate is large and the distortion shapes of the respective shots on the device substrate vary greatly. In the exposure apparatus in Japanese Patent Laid-Open No. 7-183214, the imaging performance of the projection optical system is corrected in accordance with the shot magnification of each shot, leading to a decrease in throughput because of its high frequency of correction.

SUMMARY OF THE INVENTION

The present invention provides an exposure apparatus advantageous in throughput.

The present invention in its first aspect provides an exposure apparatus for performing an exposure on each of a plurality of shot regions on a substrate in a predetermined order, the apparatus comprising: a projection optical system configured to project a pattern of an original on each of the plurality of shot regions; an adjusting unit configured to adjust imaging characteristics of the projection optical system; and a controller configured to divide the plurality of shot regions into groups based on data of a shift in the pattern of each of the plurality of shot regions and an order of the exposure, determine setting amounts of the imaging characteristics for each of the divided groups, and control the adjusting unit to set the imaging characteristics to the setting amounts for each group, wherein the setting amount is common to a plurality of shot regions in the group and varies among the groups, and wherein the controller performs the division such that the shot regions belonging to the same group have a sequential exposure order and all values of the shift in the shot regions belonging to the same group fall within a predetermined range.

The present invention in its second aspect provides an exposure apparatus for sequentially performing an exposure on a plurality of shot regions on a substrate, the apparatus comprising: a projection optical system configured to project a pattern of an original on each of the shot regions; an adjusting unit configured to adjust imaging characteristics of the projection optical system; and a controller configured to control the adjusting unit to determine a setting amount of the imaging characteristics and set the imaging characteristics to the setting amount, wherein the controller, for a group of a plurality of shot regions in a sequential exposure order, sets a common first setting amount as the setting amount and controls the adjusting unit such that the imaging characteristics become the first setting amount when exposing the group, and, for another shot region exposed immediately before or after the group, sets a second setting amount different from the first setting amount as the setting amount and controls the adjusting unit such that the imaging characteristics become the second setting amount when exposing the other shot region.

The present invention in its third aspect provides a method of performing an exposure on each of a plurality of shot regions on a substrate in a predetermined order by projecting, using a projection optical system, a pattern of an original on each of the plurality of shot regions, the method comprising: dividing the plurality of shot regions into groups based on data of a shift in the pattern of each of the plurality of shot regions and an order of the exposure; determining a setting amount of imaging characteristics of the projection optical system for each of the divided groups; and performing the exposure by adjusting such that the imaging characteristics become the setting amount for each group, wherein the setting amount is common to a plurality of shot regions in the group and varies among the groups, and wherein the division is performed such that the shot regions belonging to the same group have a sequential exposure order and all values of the shift in the shot regions belonging to the same group fall within a predetermined range.

Further features of the present invention will become apparent from the following description of exemplary embodiments with reference to the attached drawings.

BRIEF DESCRIPTION OF THE DRAWINGS

FIG. 2 is a flowchart showing an exposure method according to the present invention;

FIG. 5 is a flowchart for explaining a part of the exposure method.

DESCRIPTION OF THE EMBODIMENTS

An embodiment of the present invention will be described in detail below with reference to the accompanying drawings.

[Exposure Apparatus]

Figure 1:
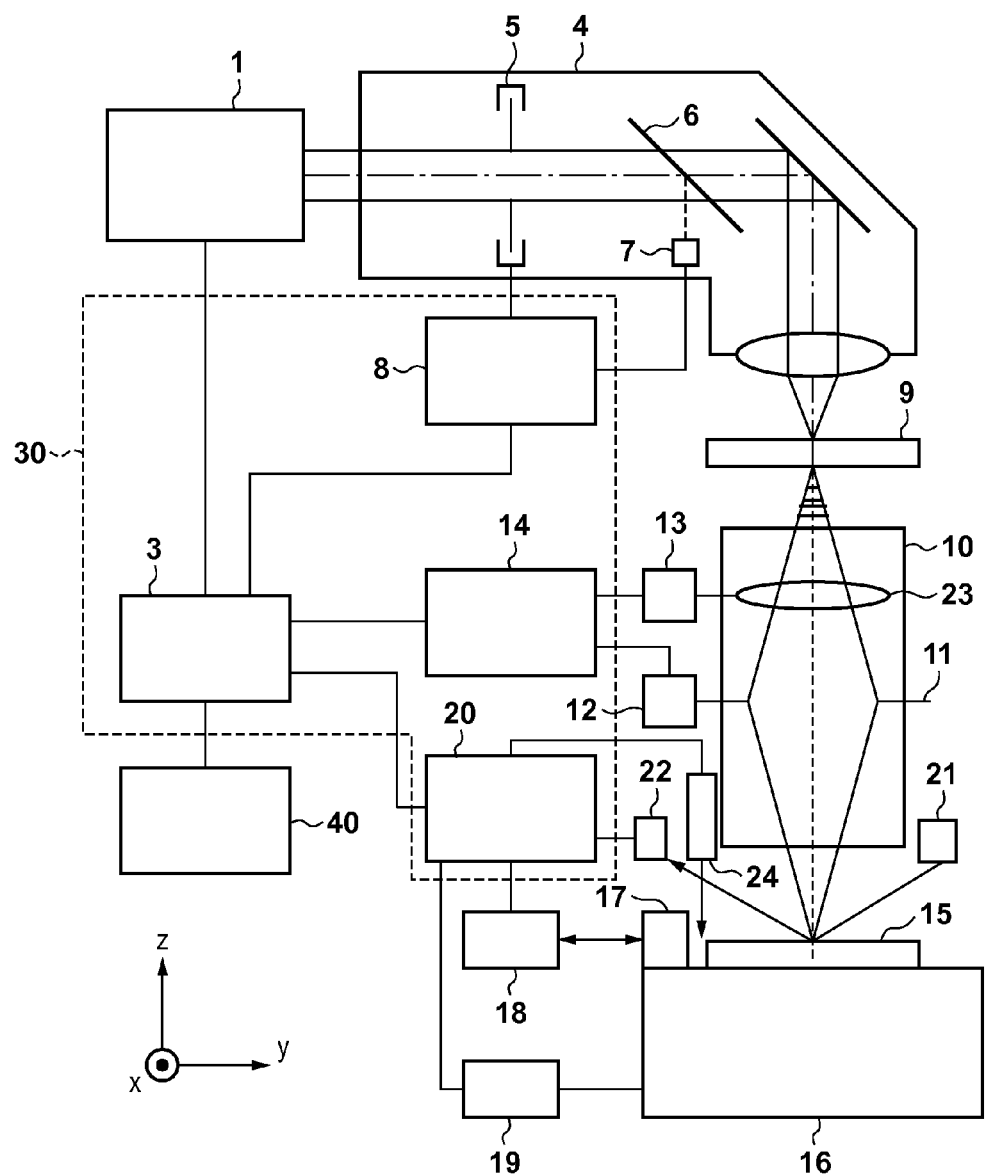
FIG. 1 is a view showing an exposure apparatus according to the present invention.

FIG. 1 is a view showing an exposure apparatus which performs an exposure on a plurality of shot regions on a substrate in a predetermined order according to the present invention. A light source 1 can output light in a plurality of wavelength bands as exposure light. Light emitted by the light source 1 is shaped into a predetermined beam shape through a shaping optical system (not shown) of an illumination optical system 4. Further, the shaped beam is incident on an optical integrator (not shown) where a number of secondary light sources are formed to illuminate a reticle (original) 9 with a uniform illuminance distribution.

The shape of an opening portion of an aperture stop 5 in the illumination optical system 4 is almost circular, and an illumination optical system controller 8 can set the diameter of its opening portion and the numerical aperture (NA) of the illumination optical system 4 to target values. In this case, the value of the ratio of the numerical aperture of the illumination optical system 4 to that of a projection optical system 10 is a coherence factor ($\sigma$ value). Therefore, the illumination optical system controller 8 can set the $\sigma$ value by controlling the aperture stop 5 of the illumination optical system 4. A half mirror 6 is positioned in the optical path of the illumination optical system 4, and a part of the exposure light for illuminating the reticle 9 is reflected and extracted by this half mirror 6. A photosensor 7 is positioned in the optical path of the reflected light by the half mirror 6 and outputs a signal corresponding to the intensity (exposure energy) of the exposure light.

The circuit pattern of a semiconductor device to be printed is formed on the reticle 9. The illumination optical system 4 irradiates the reticle 9 with exposure light. The projection optical system 10 of a refractive type, a catadioptric system, or the like projects a circuit pattern image of the reticle 9 at a reduction magnification $\beta$ (for example, ½), and is positioned to form the image in a shot region on a substrate (wafer) 15 on which a photoresist is coated. On the pupil plane of the projection optical system 10 serving as a Fourier transform plane for the reticle 9, an aperture stop 11 of the projection optical system 10 having an almost circular opening portion is positioned. The diameter of the opening portion of the aperture stop 11 can be controlled by an aperture stop driver 12 such as a motor.

An optical element driver (adjusting unit) 13 moves an optical element 23, which constitutes a part of a lens system in the projection optical system 10, along the optical axis of the projection optical system 10. This keeps the projection magnification at a satisfactory value to reduce a distortion error while preventing various aberrations of the projection optical system 10 from increasing. A projection optical system controller 14 controls the aperture stop driver 12 and the optical element driver 13 under the control of a main controller 3.

A substrate stage (wafer stage) 16 is movable in three-dimensional directions, and can move in the direction of the optical axis (Z direction) of the projection optical system 10 and within a plane (X-Y plane) perpendicular to this direction. Note that the direction, which is parallel to the optical axis of the projection optical system 10 and extends from the wafer 15 to the reticle 9, is defined as a z-axis, and directions orthogonal to the z-axis are defined as an x-axis and a y-axis. The y-axis is within a paper surface, and the x-axis is perpendicular to and is directed to come out of the paper surface. A laser interferometer 18 measures the distance to a moving mirror 17 fixed to the wafer stage 16, thereby detecting the position of the wafer stage 16 on the X-Y plane. Also, positional shifts of the wafer 15 and the wafer stage 16 are measured by using an alignment measurement device (measurement device) 24.

A stage controller 20 under the control of the main controller 3 moves the wafer stage 16 to a predetermined position on the X-Y plane by controlling a stage driver 19 such as the motor based on the measurement result by the alignment measurement device 24. A storage unit 40 can store shot information such as a shot size and a shot arrangement. The main controller 3 can determine, based on this shot information, the exposure order of respective shots so as to maximize throughput. It is also possible to calculate the set amounts of the optical characteristics of the projection optical system 10 by storing externally measured shot measurement values such as the positional shift amount, the magnification error, the distortion shape, and the three dimensional surface information of each shot. The main controller 3, the illumination optical system controller 8, the projection optical system controller 14, and the stage controller 20 constitute a controller 30.

A light projecting optical system 21 and a light receiving optical system 22 constitute a focus detector. The light projecting optical system 21 projects a plurality of light beams formed by non-exposure light to which the photoresist on the substrate 15 is not sensitive, and each light beam is focused on and reflected by the wafer 15. The light beam reflected by the wafer 15 is incident on the light receiving optical system 22. A plurality of light receiving elements for position detection are positioned in correspondence with the respective reflected light beams within the light receiving optical system 22, and the light receiving optical system 22 is configured so that the light receiving surface of each position detection light receiving element is nearly conjugate with the reflection point of each light beam on the wafer 15 by the light receiving optical system 22. The positional shift of the surface of the wafer 15 in the optical axis direction of the projection optical system 10 is measured as that of light beams incident on the light receiving elements for position detection within the light receiving optical system 22.

[Exposure Method]

FIG. 2 is a flowchart for explaining an exposure method according to the present invention. First, the main controller 3 loads the wafer 15 in step S1. Then, in step S2, the main controller 3 determines the exposure order of the respective shots from the size of the wafer 15 and layout information. In order to increase throughput, the main controller 3 can determine the exposure order of the respective shots so as to minimize the moving amount of the wafer stage 16, that is, a stage driving time.

In step S3, the main controller 3 checks whether distortion data of all the exposure target shots on the wafer 15 is stored in the storage unit 40. If the distortion data is stored in the storage unit 40, the main controller 3 loads the distortion data of all the shots stored in the storage unit 40 in step S4. This distortion data is measured in advance by an overlay length measuring device or the like and is stored in advance in the storage unit 40. If the distortion data is not stored in the storage unit 40, the main controller 3 measures the shape of each shot as an underlayer by using the alignment measurement device 24 and loads the distortion data of all the measured shots in step S5. In step S6, the main controller 3 calculates the projection magnification setting amount of the projection optical system 10 in order to perform an overlay exposure of the image of the pattern of the reticle 9 in accordance with each shot shape.

Then, the main controller 3 drives the wafer stage 16 and moves it to an exposure target shot in step S7. In step S8, the main controller 3 determines whether to drive the optical element driver (adjusting unit) 13 configured to adjust the projection magnification (imaging characteristics) of the projection optical system 10. If the main controller 3 determines to drive the optical element driver 13 in step S8, it drives, based on the setting amount calculated in step S6, the optical element driver 13 via the projection optical system controller 14 to set (correct) the projection magnification. After the setting of the projection magnification is completed, the main controller 3 exposes the exposure target shot in step S10. If the main controller 3 determines not to drive the optical element driver 13 in step S8, the process advances to step S10 where the main controller 3 exposes the exposure target shot. In step S11, the main controller 3 determines whether the exposed shot is a final shot. If the exposed shot is not the final shot, the process returns to step S7 where the main controller 3 moves to a next exposure target shot. If the exposed shot is the final shot, the process advances to step S12 where the main controller 3 unloads the wafer 15. It is possible, by using the exposure method based on this flowchart, to accurately align the pattern of the reticle 9 with respect to the distortion of the shot as the underlayer to perform an exposure, and to increase throughput.

An obtaining process of the setting amount of the projection magnification in step S6 will now be described with reference to FIG. 5. First, in step S61, the main controller 3 sets, for group 1, shot 1 and shot 2 in a sequential exposure order. Next, in step S62, the main controller 3 obtains a minimum projection magnification $\beta_{min}$ and a maximum projection magnification $\beta_{max}$ from the projection magnification of each shot in the group. In step S63, the main controller 3 determines whether a difference ($\beta_{max}-\beta_{min}$) between the maximum projection magnification $\beta_{max}$ and the minimum projection magnification $\beta_{min}$ is larger than a projection magnification tolerance amount Tol. If the difference ($\beta_{max}-\beta_{min}$) is smaller than the projection magnification tolerance amount Tol, the main controller 3 adds a shot next in the exposure order to a group under processing in step S64, and repeats steps S62 and S63. If the difference ($\beta_{max}-\beta_{min}$) is larger than the projection magnification tolerance amount Tol, the process advances to step S65 where the main controller 3 determines shots belonging to the same group under processing. In step S65, the main controller 3 sets shots which satisfy $\beta_{max}-\beta_{min} \leq$ Tol as shots belonging to the group. Then, in step S66, the main controller 3 calculates a projection magnification setting amount $\beta_g$ common to all shots belonging to the group. The projection magnification setting amount $\beta_g$ is common to the plurality of shots in the group and varies among groups. The common projection magnification setting amount $\beta_g$ may be, for example, an arithmetic mean value ($\beta_{max}+\beta_{min}$)/2 between the maximum value $\beta_{max}$ and the minimum value $\beta_{min}$, or an arithmetic mean value or a weighted average value of the projection magnification of each shot in consideration of the projection magnification distribution of the respective shots. Then, if all the shots on the wafer 15 are included in any of the groups in step S67, step S6 is completed. If the shot which is not included in any group still remains, the process advances to step S68. In step S68, the main controller 3 sets, for the next group, a next shot and a shot after the next shot in a sequential exposure order, repeats steps S62 to S66, divides all the shots, and obtains the common projection magnification setting amount $\beta_g$ for each group. Note that the controller other than the main controller 3 may perform the division.

The obtaining process of the projection magnification setting amount in step S6 will be subsequently described in detail with reference to FIGS. 3A, 3B, 4A, and 4B. FIG. 3A shows an example in which twelve shots are positioned on the wafer 15. In step S2, the main controller 3 generally determines the exposure order of the respective shots so as to minimize the stage moving amount for the purpose of maximizing throughput. Therefore, shots 1 to 12 are generally exposed in this order, as shown in FIG. 3A.

Figure 3B:
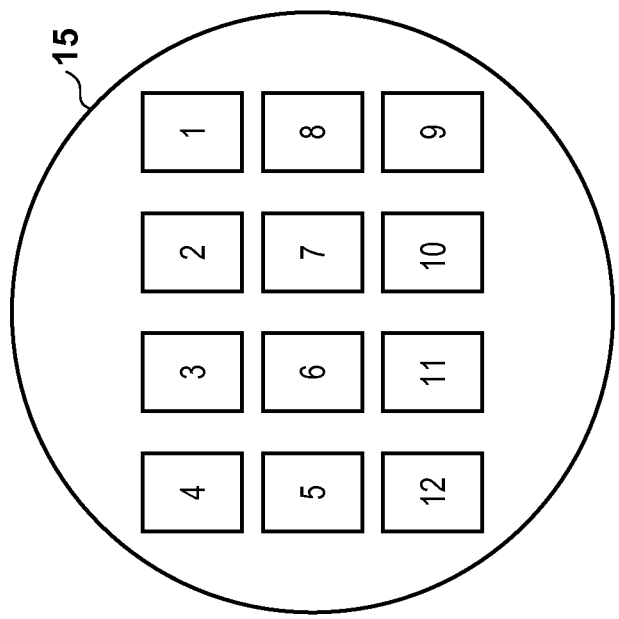
FIGS. 3A and 3B are views each showing the arrangement and the exposure order of respective shots on a wafer surface.
Figure 3A:
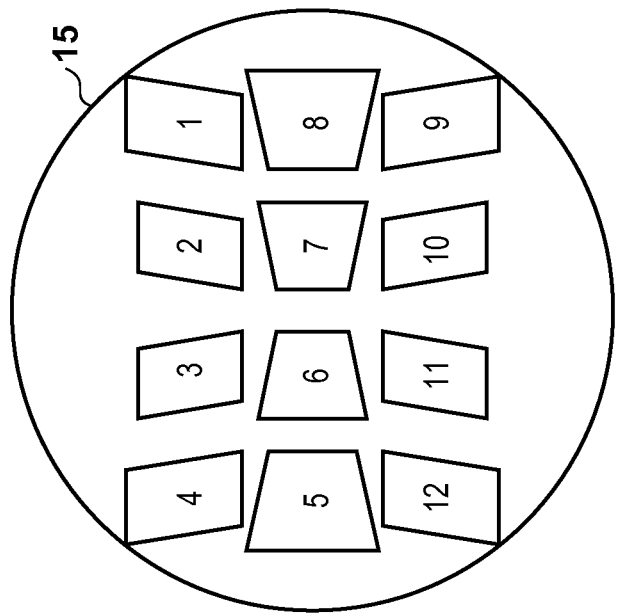

Next, FIG. 3B shows an example of the wafer 15 for the BSI sensor. The BSI sensor undergoes a step of bonding a device substrate to a supporting substrate to polish the device substrate, causing a distortion in each shot. When performing an overlay exposure on this BSI wafer 15, the projection magnification of the projection optical system 10 needs to be corrected in accordance with a distorted shot shape. The distortion amount of each shot is needed to do this. The main controller 3 obtains the distortion amount of each shot in step S4 or S5 of FIG. 2.

Figure 4A:
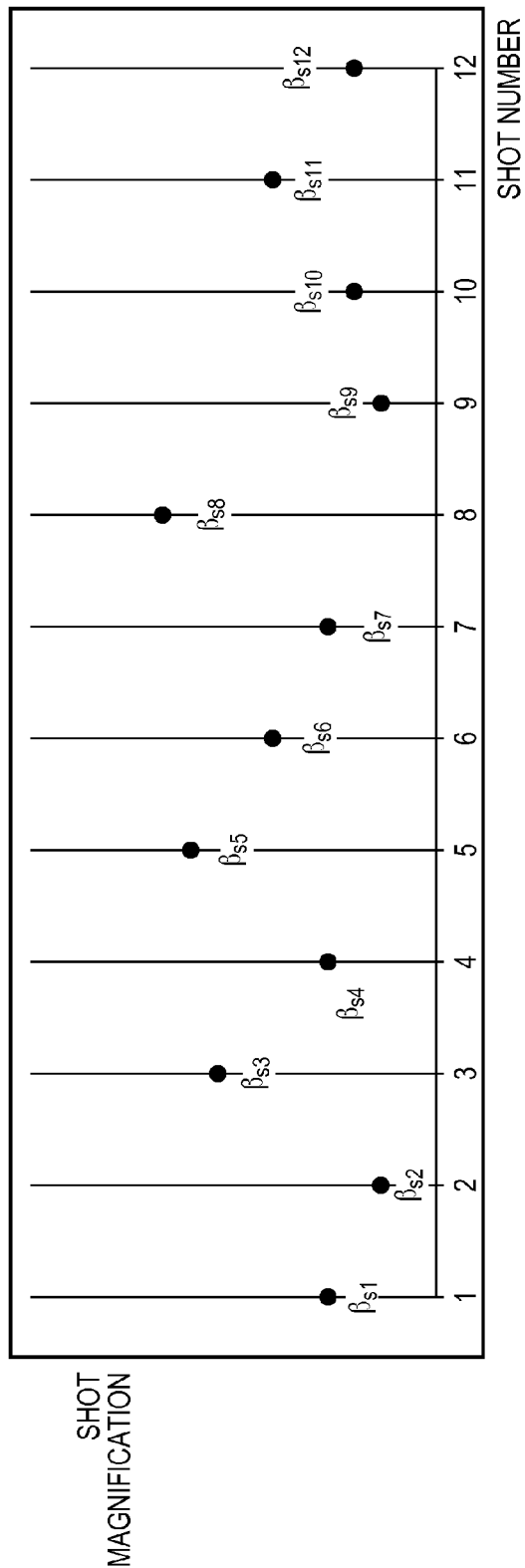
FIGS. 4A and 4B are views showing the magnification of each shot on the wafer surface.

FIG. 4A shows the obtained shot distortion amount (shot magnification). FIG. 4A shows magnifications $\beta_{s1}$ to $\beta_{s12}$ of the measured respective shots. It is conceivable to correct the projection magnification in accordance with each of these shot magnifications and perform an exposure. By doing so, however, the optical element driver 13 needs to be driven every time each shot is exposed, leading to a decrease in throughput. On the other hand, there is a tolerance for correction of the projection magnifications from a manufacturing viewpoint, and there is no large influence on device performance even if the magnifications vary within that tolerance.

Figure 4B:
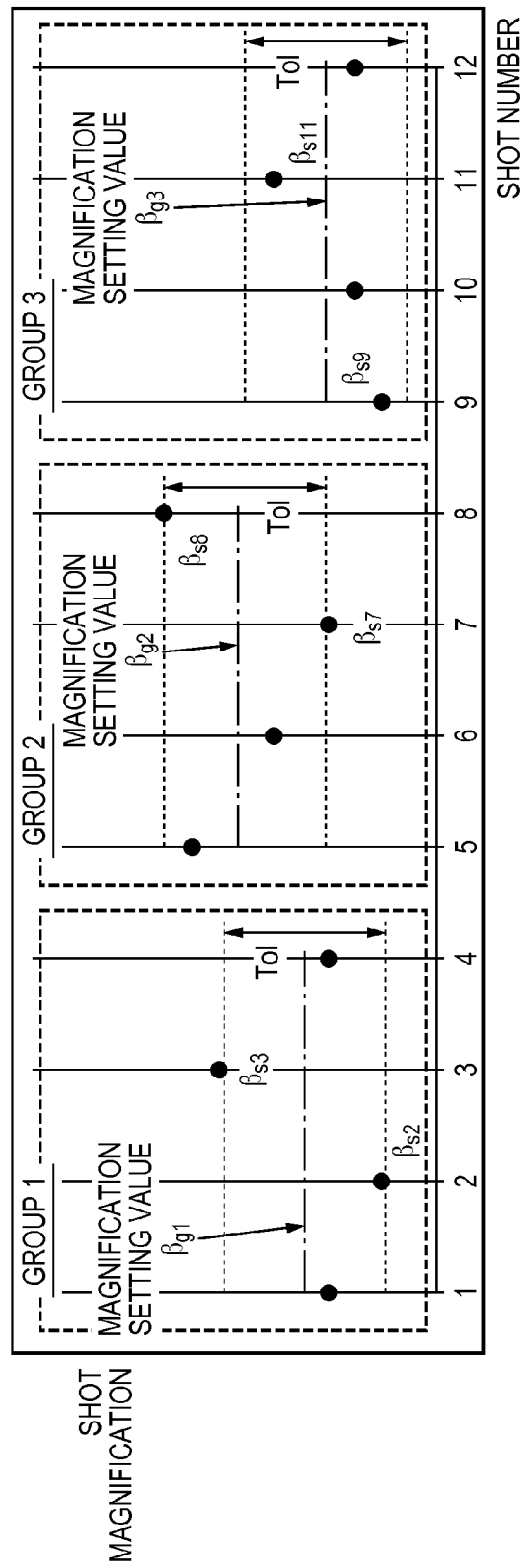

FIG. 4B shows the relationship between the division of the respective shots with respect to the projection magnification tolerance amount Tol used in the present invention and the common projection magnification setting amount $\beta_g$ of each group. In shots 1 to 4, the minimum magnification is a magnification $\beta_{s2}$ of shot 2, the maximum magnification is a magnification $\beta_{s3}$ of shot 3, and the difference between them falls within the projection magnification tolerance amount Tol, setting shots 1 to 4 in group (first group) 1. The common projection magnification (first setting amount) when exposing shots 1 to 4 of group 1 is determined as an arithmetic mean value $\beta_{g1}=(\beta_{s2}+\beta_{s3})/2$ between the maximum magnification and the minimum magnification. This makes it possible to obtain a satisfactory exposure result without driving the optical element driver 13 while exposing group 1. Similarly, also in shots 5 to 8 of group (second group) 2, the same effect is obtained by setting the common projection magnification (second setting amount) to an arithmetic mean value $\beta_{g2}=(\beta_{s7}+\beta_{s8})/2$ between a minimum magnification $\beta_{s7}$ and a maximum magnification $\beta_{s8}$.

In shots 9 to 12 of group 3, all the shots fall within the tolerance amount Tol. In this case as well, however, the same effect as those for groups 1 and 2 is obtained by setting the common projection magnification (third setting amount) to $\beta_{g3}=(\beta_{s9}+\beta_{s11})/2$. The setting of the projection magnifications has been described in this embodiment. However, throughput can be improved by applying the above-mentioned method as well when setting other optical characteristics such as the distortion of the projection optical system 10. The above-mentioned method can also be applied when correcting the focus position of the projection optical system 10 with respect to the defocus measurement value of each shot on the wafer 15. The setting amount of the projection magnification, the distortion, the focus, or the like includes a size and an orientation.

[Device Manufacturing Method]

Next, a manufacturing method of a device (for example, a semiconductor device or a liquid crystal display device) according to an embodiment of the present invention will be explained. The semiconductor device is manufactured through a pre-process of forming an integrated circuit on a wafer, and a post-process of completing, as a product, an integrated circuit chip formed on the wafer by the pre-process. The pre-process includes a step of exposing a wafer coated with a photosensitive agent by using the above-mentioned exposure apparatus, and a step of developing the wafer. The post-process includes an assembly step (dicing and bonding) and a packaging step (encapsulation). The liquid crystal display device is manufactured through a process of forming a transparent electrode. The process of forming the transparent electrode includes a step of applying a photosensitive agent to a glass substrate on which a transparent conductive film is deposited, a step of exposing the glass substrate coated with the photosensitive agent by using the above-described exposure apparatus, and a step of developing the glass substrate. According to the device manufacturing method in the embodiment, a higher-quality device than a conventional one can be manufactured.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-202122, filed Sep. 30, 2014, which is hereby incorporated by reference herein in its entirety.

What is claimed is:

1. An exposure apparatus for performing an exposure on each of a plurality of shot regions on a substrate in a predetermined order, the apparatus comprising:
   a projection optical system configured to project a pattern of an original on each of the plurality of shot regions;
   an adjusting unit configured to adjust imaging characteristics of the projection optical system; and
   a controller configured to divide the plurality of shot regions into groups based on data of a shift in the pattern of each of the plurality of shot regions and an order of the exposure, determine a setting amount of the imaging characteristics for each of the divided groups, and control the adjusting unit to set the imaging characteristics to the determined setting amount for each group,
   wherein the determined setting amount of a group is commonly used for a plurality of shot regions in the group when performing an exposure on the plurality of shot regions in the group, and the determined setting amounts of the groups are different from one another, and
   wherein the controller performs the division such that the shot regions belonging to the same group have a sequential exposure order and all values of the shift in the shot regions belonging to the same group fall within a predetermined range.

2. The apparatus according to claim 1, further comprising a storage unit configured to store the data of the shift, wherein the controller divides the plurality of shot regions into groups based on the data of the shift stored by the storage unit.

3. The apparatus according to claim 1, further comprising a measurement device configured to measure the shift for each of the plurality of shot regions,
   wherein the controller divides the plurality of shot regions into groups based on the data of the shift measured by the measurement device.

4. The apparatus according to claim 1, wherein the shift includes a shift in a shape of each of the plurality of shot regions and the imaging characteristics include one of a projection magnification and a distortion of the projection optical system.

5. The apparatus according to claim 1, wherein the adjusting unit includes an optical element driver configured to drive an optical element which constitutes the projection optical system.

6. The apparatus according to claim 1, wherein the shift includes a defocus of each of the plurality of shot regions and the imaging characteristics include a focus position of the projection optical system.

7. The apparatus according to claim 1, wherein the controller determines the setting amount that is commonly used for the group based on an arithmetic mean value between a maximum value and a minimum value of the shift in the shot regions belonging to the same group.

8. The apparatus according to claim 1, wherein the controller determines the setting amount that is commonly used for the group based on an arithmetic mean value of all the values of the shift in the shot regions belonging to the same group.

9. The apparatus according to claim 1, wherein the controller determines the setting amount that is commonly used for the group based on a weighted average value of all the values of the shift in the shot regions belonging to the same group.

10. An exposure apparatus for sequentially performing an exposure on a plurality of shot regions on a substrate, the apparatus comprising:
    a projection optical system configured to project a pattern of an original on each of the plurality of shot regions;
    an adjusting unit configured to adjust imaging characteristics of the projection optical system; and
    a controller configured to control the adjusting unit to determine a setting amount of the imaging characteristics and set the imaging characteristics to the setting amount,
    wherein the controller,
    for a group of a plurality of shot regions in a sequential exposure order, sets a common first setting amount as the setting amount for the group and controls the adjusting unit such that the imaging characteristics become the first setting amount when exposing the group, and,
    for another shot region exposed immediately before or after the group of the plurality of shot regions, sets a second setting amount different from the first setting amount as the setting amount for the another shot region and controls the adjusting unit such that the imaging characteristics become the second setting amount when exposing the another shot region.

11. The apparatus according to claim 10, wherein, setting the group as a first group, for a second group of a plurality of shot regions in a sequential exposure order which is different from the first group and includes the another shot region, the controller sets the second setting amount and controls the adjusting unit to set the imaging characteristics to the second setting amount when exposing the second group.

12. A method of performing an exposure on each of a plurality of shot regions on a substrate in a predetermined order by projecting, using a projection optical system, a pattern of an original on each of the plurality of shot regions, the method comprising:

dividing the plurality of shot regions into groups based on data of a shift in the pattern of each of the plurality of shot regions and an order of the exposure;

determining a setting amount of imaging characteristics of the projection optical system for each of the divided groups; and performing the exposure by adjusting the imaging characteristics such that the imaging characteristics become the determined setting amount for each group, wherein the determined setting amount of a group is commonly used for a plurality of shot regions in the group when performing an exposure on the plurality of shot regions in the group, and the determined setting amounts of the groups are different from one another, and wherein the division is performed such that the shot regions belonging to the same group have a sequential exposure order and all values of the shift in the shot regions belonging to the same group fall within a predetermined range.

13. A method of manufacturing a device, the method comprising:

exposing a substrate by using an exposure apparatus for performing an exposure on each of a plurality of shot regions on the substrate in a predetermined order;

developing the exposed substrate; and processing the developed substrate to manufacture the device, the exposure apparatus comprising:

a projection optical system configured to project a pattern of an original on each of the plurality of shot regions;

an adjusting unit configured to adjust imaging characteristics of the projection optical system; and a controller configured to divide the plurality of shot regions into groups based on data of a shift in the pattern of each of the plurality of shot regions and an order of the exposure, determine a setting amount of the imaging characteristics for each of the divided groups, and control the adjusting unit to set the imaging characteristics to the determined setting amount for each group, wherein the determined setting amount of a group is commonly used for a plurality of shot regions in the group when performing an exposure on the plurality of shot regions in the group, and the determined setting amounts of the groups are different from one another, and wherein the controller performs the division such that the shot regions belonging to the same group have a sequential exposure order and all values of the shift in the shot regions belonging to the same group fall within a predetermined range.

14. A method of manufacturing a device, the method comprising:

exposing a substrate by using an exposure apparatus for sequentially performing an exposure on a plurality of shot regions on the substrate;

developing the exposed substrate; and processing the developed substrate to manufacture the device, the exposure apparatus comprising:

a projection optical system configured to project a pattern of an original on each of the plurality of shot regions;

an adjusting unit configured to adjust imaging characteristics of the projection optical system; and a controller configured to control the adjusting unit to determine a setting amount of the imaging characteristics and set the imaging characteristics to the setting amount, wherein the controller, for a group of a plurality of shot regions in a sequential exposure order, sets a common first setting amount as the setting amount for the group and controls the adjusting unit such that the imaging characteristics become the first setting amount when exposing the group, and, for another shot region exposed immediately before or after the group of the plurality of shot regions, sets a second setting amount different from the first setting amount as the setting amount for the another shot region and controls the adjusting unit such that the imaging characteristics become the second setting amount when exposing the another shot region.

* * * * *